United States Patent
Kim et al.

(10) Patent No.: US 7,411,638 B2
(45) Date of Patent: Aug. 12, 2008

(54) LIQUID CRYSTAL DISPLAY DEVICE AND METHOD OF FABRICATING THE SAME HAVING PARTICULAR DRAIN ELECTRODES AND SOURCE ELECTRODES

(75) Inventors: Binn Kim, Seoul (KR); Soo Young Yoon, Gyeonggi-do (KR); Min Doo Chun, Seoul (KR)

(73) Assignee: LG Display Co., Ltd., Seoul (KR)

( * ) Notice: Subject to any disclaimer, the term of this patent is extended or adjusted under 35 U.S.C. 154(b) by 410 days.

(21) Appl. No.: 10/878,544

(22) Filed: Jun. 29, 2004

(65) Prior Publication Data

US 2005/0140909 A1    Jun. 30, 2005

(30) Foreign Application Priority Data

Dec. 29, 2003    (KR) ...................... 10-2003-0099349

(51) Int. Cl.
*G02F 1/136* (2006.01)
*G02F 1/1345* (2006.01)

(52) U.S. Cl. .............................. 349/43; 349/42; 349/151

(58) Field of Classification Search .................... 349/43, 349/42, 45–47, 151
See application file for complete search history.

(56) References Cited

U.S. PATENT DOCUMENTS

| | | | | |
|---|---|---|---|---|
| 5,852,485 | A | * 12/1998 | Shimada et al. | 349/141 |
| 5,977,562 | A | * 11/1999 | Hirakata et al. | 257/72 |
| 6,128,061 | A | * 10/2000 | Lee et al. | 349/141 |
| 6,256,081 | B1 | * 7/2001 | Lee et al. | 349/141 |
| 2005/0185107 | A1 | * 8/2005 | Ban et al. | 349/42 |

* cited by examiner

*Primary Examiner*—Mike Qi
(74) *Attorney, Agent, or Firm*—Morgan, Lewis & Bockius LLP

(57) ABSTRACT

An liquid crystal display device includes a source line between first and second drain lines, a first and second gate lines between the first drain line and the source line and between the second drain line and the source line, a plurality of first and second drain electrodes extending from the first and second drain lines, and a plurality of first and second source electrodes extending in first and second directions from the source line, wherein the plurality of first source electrodes are alternated with the plurality of first drain electrodes on the first gate line, and the plurality of second source electrodes are alternated with the plurality of second drain electrodes on the second gate line.

11 Claims, 8 Drawing Sheets

LIQUID CRYSTAL DISPLAY DEVICE AND METHOD OF FABRICATING THE SAME HAVING PARTICULAR DRAIN ELECTRODES AND SOURCE ELECTRODES

This application claims the benefit of the Korean Application No. P2003-99349, filed on Dec. 29, 2003, which is hereby incorporated by reference.

BACKGROUND OF THE INVENTION

1. Field of the Invention

The present invention relates to a liquid crystal display (LCD) device, and more particularly, to an LCD device capable of easily carrying a driving unit having a switching element on a liquid crystal panel, and a fabrication method thereof.

2. Description of the Related Art

Generally, different kinds of flat panel display devices have been used in portable telephones, computer monitors, and television sets because of their superior visibility and low power consumption characteristics. These flat panel display devices have similar heat emission amounts to cathode ray tube (CRTs) devices having the same screen size, and include plasma display panel (PDP) devices, field emission display (FED) devices, and LCD devices.

The LCD device includes two substrates facing each other and each having an electrode for generating an electric field, and a liquid crystal layer interposed therebetween to display images by controlling liquid crystal molecules using the electric field generated by a voltage applied to the electrodes of the respective substrates.

FIG. 1 is a plane view of an LCD device according to the related art. As shown in FIG. 1, the LCD device includes a liquid crystal panel 5 and a driving unit 7 for driving the liquid crystal panel 5. The liquid crystal panel 5 includes a first substrate 1, a second substrate 2, and a liquid crystal layer (not shown) interposed therebetween. The first substrate 1 is provided with a plurality of gate bus lines, a plurality of data bus lines vertically crossing the gate bus lines, and thin film transistors formed at cross points of the gate and data bus lines (not shown). The second substrate 2 is provided with a color filter layer and a common electrode (not shown).

The plurality of gate and data bus lines are arranged on the first substrate 1 to cross each other perpendicularly. At each of the cross points of the gate and data bus lines, a thin film transistor (not shown) is provided. Each of the gate bus lines is connected to a gate electrode of the thin film transistor arranged in one column or one row, and each of the data bus lines is connected to a source electrode arranged in one row or one column. A drain electrode of the thin film transistor is connected with a corresponding pixel electrode. A unit pixel region to display a unit pixel is defined by one thin film transistor and one pixel electrode. The second substrate 2 is provided with a color filter layer consisting of red (R), Green (G) and blue (B) color filters, and a black matrix (BM) layer for partitioning the color filters. A common electrode is formed on the color filters.

The driving unit 7 includes a gate driving unit 27 for supplying gate signals, and a timing control unit 11 which supplies control signals for controlling the gate driving unit 27 and a data driving unit 17. The gate driving unit 27 includes a gate printed circuit board (PCB) 33 on which transmission lines of the control signals provided by the timing control unit 11 are mounted, and a gate drive integrated circuit (IC) for generating predetermined gate signals in response to the control signals supplied by the gate PCB 33.

The data driving unit 17 includes a data printed circuit board (PCB) 31 on which transmission lines of the control signals provided by the timing control unit 11 are mounted, and a data drive IC 15 for generating predetermined data signals in response to the control signals supplied by the data PCB 31. The gate drive IC 25 and the data drive IC 15 are mounted on respective tape carrier packages (TCPs) and are connected to the liquid crystal panel 5, or are directly mounted on the liquid crystal panel 5 in a chip on glass (COG) manner. FIG. 1 shows that the gate drive IC 25 and the data drive IC 15 are mounted on respective TCPs 13 and 23.

Control signals generated by the timing control unit 11 are supplied to the gate drive IC 25 through the signal transmission lines mounted on the gate PCB 33. The gate drive IC 25 generates gate signals in response to the control signals and supplies the generated gate signals to the liquid crystal panel 5. The gate signal includes a gate low voltage and a gate high voltage. The gate high voltage turns on the thin film transistors of the liquid crystal panel 5, and the gate low voltage turns off the thin film transistors of the liquid crystal panel 5. Accordingly, the gate drive IC 25 supplies the gate high voltage to the liquid crystal panel 5 during a very short time period of one frame, and supplies the gate low voltage during a remaining time period of one frame. By repeating the above operation, the gate drive IC 25 allows each gate high voltage to be supplied to each gate bus line of the liquid crystal panel 5.

The gate drive IC 25 supplies the gate high voltage, whereas the data drive IC 15 supplies data signals to the liquid crystal panel 5 according to the control signals generated by the timing control unit 11 and supplied through the signal transmission lines mounted on the data PCB 31.

For instance, when the gate high voltage is supplied to the first gate bus line of the liquid crystal panel 5, thin film transistors of respective pixel regions connected to the first gate bus line are turned on. At this time, the data signals supplied by the data drive IC 15 are applied to the pixel electrodes via the thin film transistors connected to the first gate bus line. Also, a common voltage is applied to the common electrode. A potential difference between the data signals applied to the respective pixel electrodes and the common voltage generates an electric field. The generated electric field causes displacement of liquid crystal molecules, so that transmission amount of light is controlled, thereby displaying an image with a gray scale.

In such LCD devices, the gate driving unit 27 is mounted on the liquid crystal panel 5 as shown in FIG. 2 so as to make the LCD devices thinner and reduce fabrication costs. Further, even the data and gate driving units 17, 27 are mounted on the liquid crystal panel as shown in FIG. 3. When either the gate driving unit 27 or the data driving unit 17 is mounted on the liquid crystal panel 5, a large switching element should be essentially provided where buffer TFTs are connected in parallel. U.S. Pat. No. 6,552,768 discloses a large switching element including the aforementioned buffer TFTs. The large switching element has a fast response speed, and mainly uses amorphous silicon having process convenience and good uniformity rather than polycrystalline silicon, which is difficult to process using laser crystallization.

The large switching element shown in FIG. 4 includes a gate electrode 56 connected to a gate line 52 formed on a substrate of a liquid crystal panel, a source electrode 60 connected to a source line 64, a drain electrode 72 facing the source electrode 60 and connected to a drain line 73, and a semiconductor layer 68 forming a channel between the source and drain electrodes 60, 72. FIG. 4 shows that one source electrode 60 and one drain electrode 70 are related with one gate electrode 56. However, in a real large switching element, the gate electrode 56 extend in an up and down direction, and pairs of source and drain electrodes are arranged in parallel, thereby forming two or more buffer TFTs. In the switching element of FIG. 4, the semiconductor layer 68 has a stack structure of an active layer and an ohmic contact layer contacting the source and drain electrodes 60, 72.

The large switching element has a large channel width W1 for switching at a high voltage, and is different from one TFT provided in one pixel region, and two or more TFTs provided in one pixel region disclosed in Japanese Laid Open Publication No. 5-341316. For example, the TFTs provided in pixel regions have a few μm to a few ten μm, whereas the switching elements provided in the gate driving unit or the data driving unit mounted on the liquid crystal panel have a few thousands μm to a few ten thousands μm.

Thus, when the channel width of the switching element increases to a considerable degree, the LCD device is confronted with a limitation due to a process margin. In other words, since the TFTs having a large channel width are connected in parallel, they occupy a considerable area. However, area occupied by the large switching elements should not be above the actual process margin on the liquid crystal panel. As a result, it becomes difficult to mount the switching elements connected in parallel on the liquid crystal panel. Accordingly, there has been a strong need to develop a gate driving unit or a data driving unit capable of compensating for the large channel width of the large switching elements.

Also, when the mounting area of the large switching elements increases, the related art LCD device does not meet the present trend in to have slim and lightweight LCD devices.

SUMMARY OF THE INVENTION

Accordingly, the present invention is directed to an LCD and a method of fabricating the same that substantially obviates one or more problems due to limitations and disadvantages of the related art.

An object of the present invention is to provide an LCD and a method of fabricating the same that is capable of easily carrying a driving unit including switching elements on a liquid crystal panel.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described herein, there is provided an LCD device comprising a liquid crystal panel for displaying an image, and a driving unit mounted on the liquid crystal panel and having a switching element for controlling an output, wherein the switching element comprises first and second drain lines, a source line formed between the first and second drain lines, first and second gate lines formed between the first drain line and the source line and between the second drain line and the source line, a plurality of first and second drain electrodes extending from the first and second drain lines, and a plurality of first and second source electrodes extending in first and second directions from the source line, wherein the plurality of first source electrodes are alternated with the plurality of first drain electrodes on the first gate line, and the plurality of second source electrodes are alternated with the plurality of second drain electrodes on the second gate line.

In another aspect, there is provided a method of fabricating an LCD device, the method comprising depositing a gate metal film on a substrate to form first and second gate lines, forming a gate insulating layer on the substrate to cover the first and second gate lines, forming a semiconductor layer on the gate insulating layer, the semiconductor layer being greater in width than the gate line, depositing a source/drain metal film on the semiconductor layer to form (a) a source line between the first gate line and the second gate line, (b) a plurality of first and second source electrodes extending in first and second from the source line, (c) a first drain line at a left side of the first gate line, (d) a plurality of first drain electrodes extending from the first drain line on the first gate line, (e) a second drain line at a right side of the second gate line, and (f) a plurality of second drain electrodes extending from the drain line on the second gate line, and forming a passivation layer on a resultant structure of the substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

As aforementioned, a driving unit for driving a liquid crystal panel can be mounted in the liquid crystal panel. The driving unit is provided with a switching element including two or more buffer thin film transistors connected in parallel.

Figure 1:
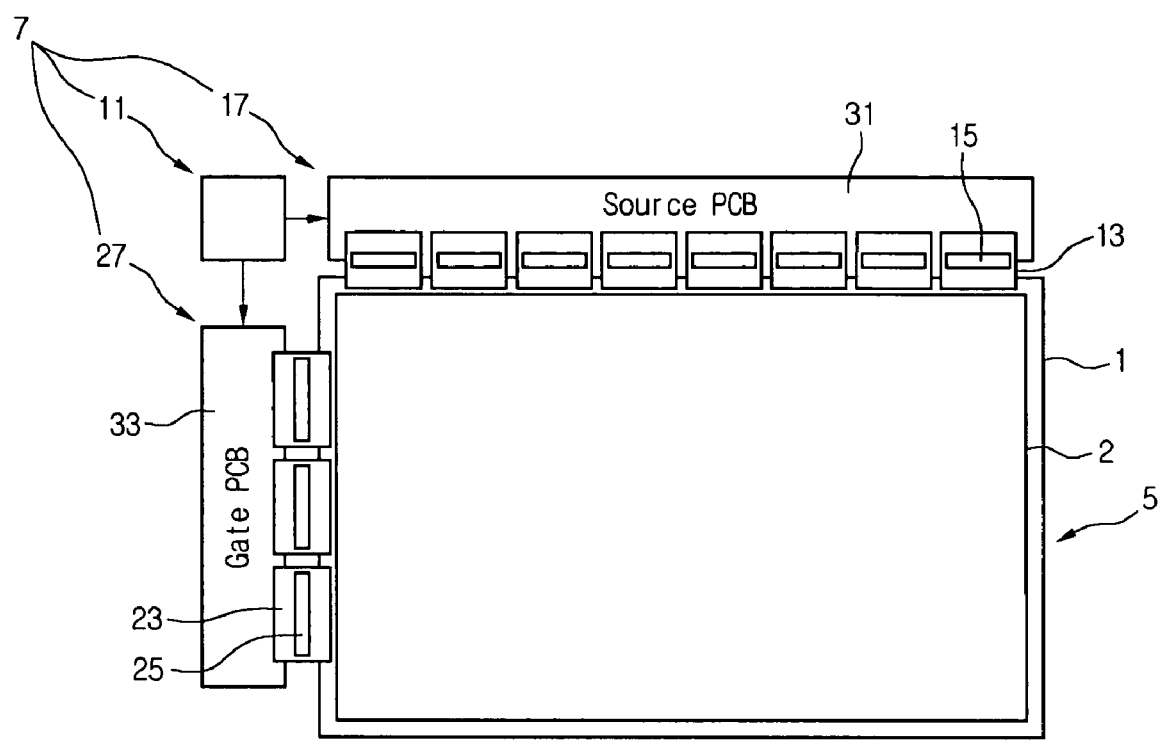
FIG. 1 is a plane view of an LCD according to the related art.
Figure 2:
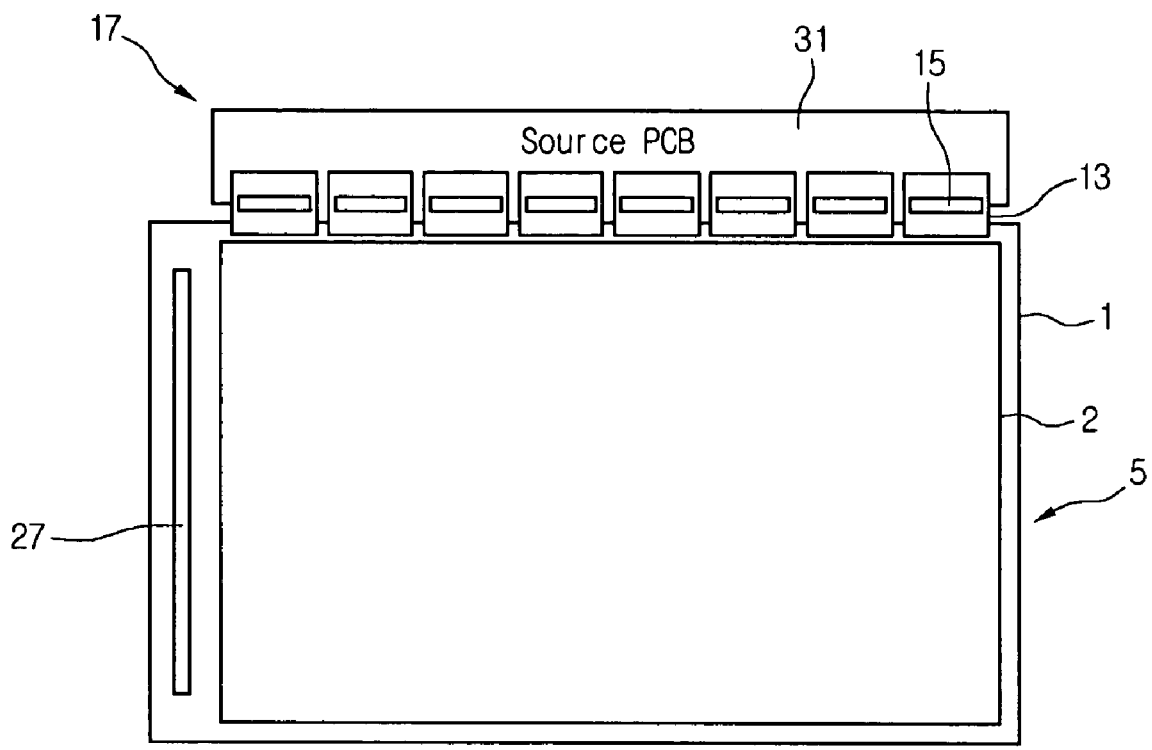
FIG. 2 is a plane view of an LCD provided with a gate driving unit according to the related art.
Figure 3:
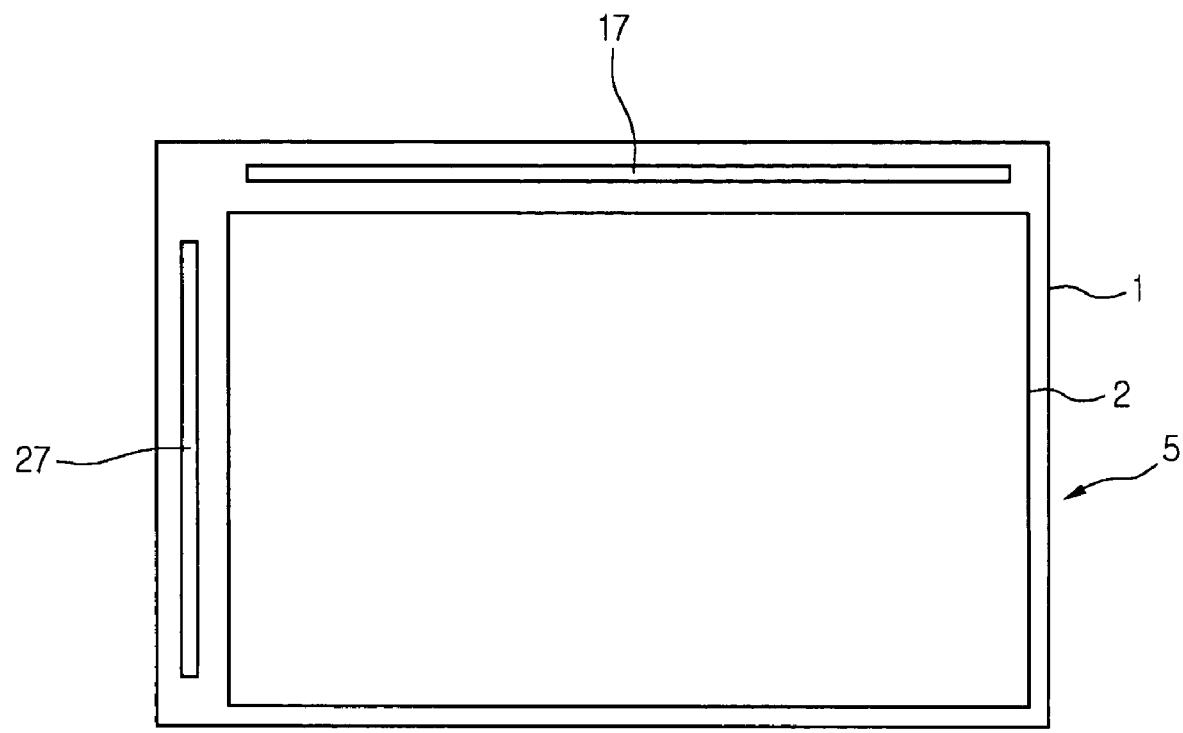
FIG. 3 is a plane view of an LCD provided with a gate driving unit and a data driving unit according to the related art.
Figure 4:
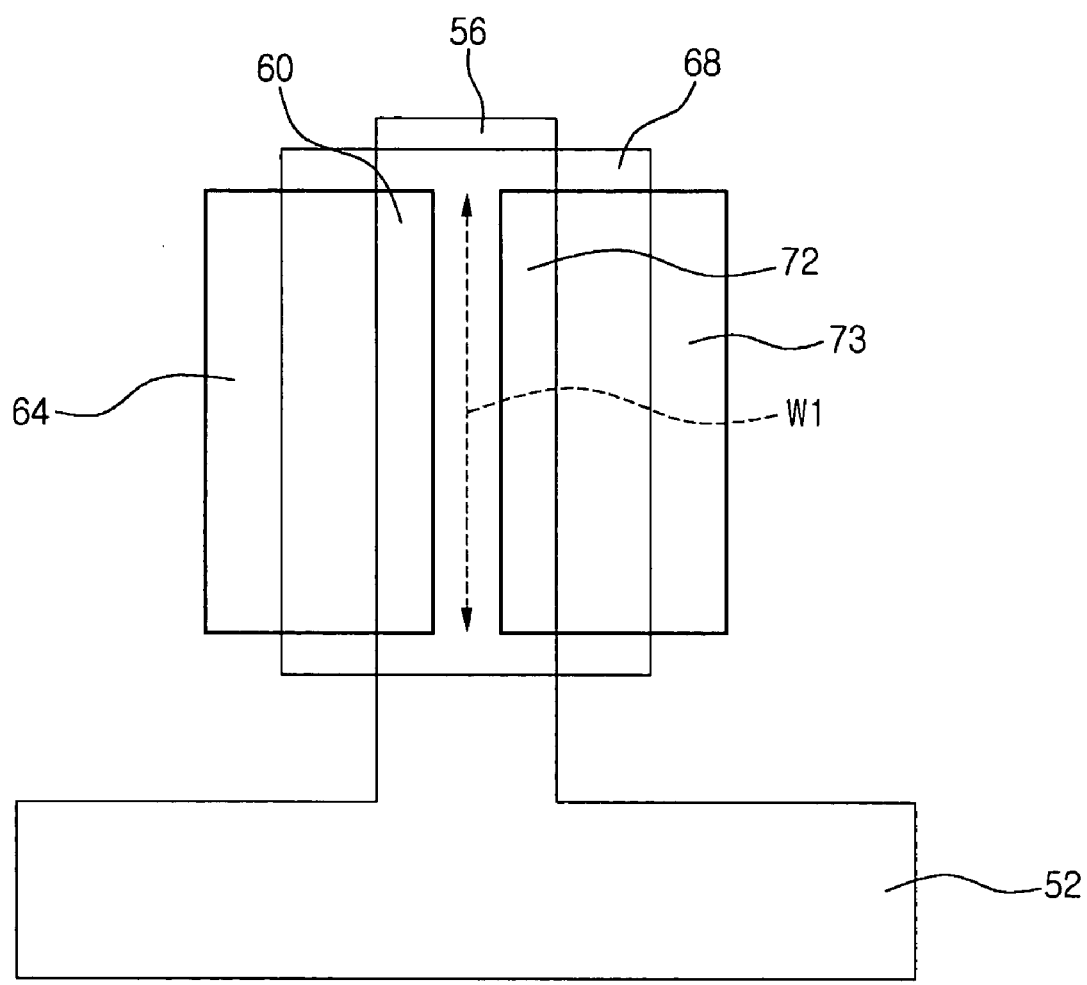
FIG. 4 is a plane view of a switching element provided in a driving unit of the related art LCD.
Figure 5:
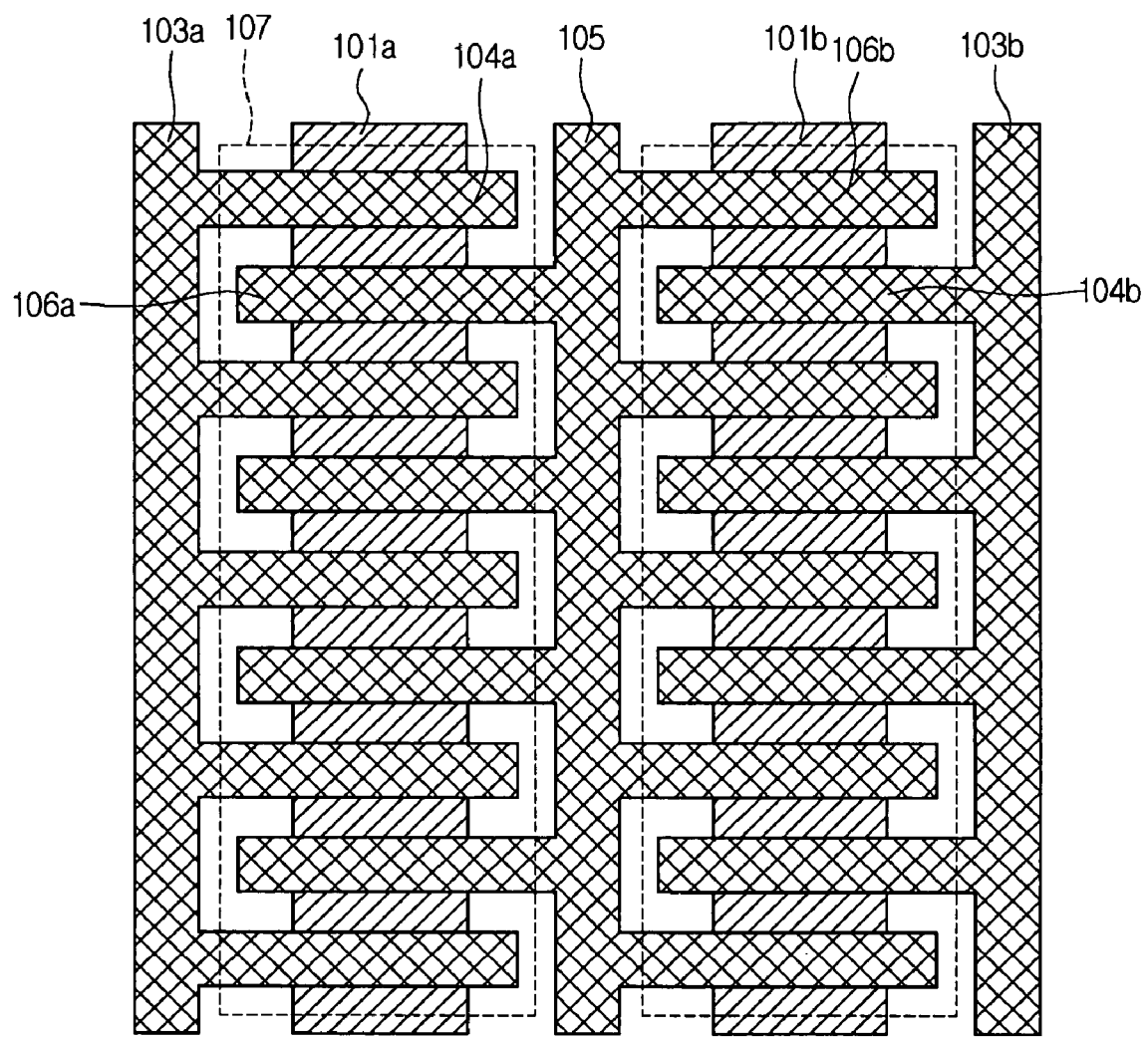
FIG. 5 is a plane view of a switching element provided in a driving unit of an LCD device according to an embodiment of the present invention.

FIG. 5 is a plane view of a switching element provided in a driving unit of an LCD according to the present invention. As shown in FIG. 5, the switching element of the present invention includes a first drain line 103a and a second drain line 103b formed at both sides, and a source line 105 formed in parallel to the first and second drain lines 103a, 103b at a center line between the first and second drain lines 103a, 103b. A first gate line 101a is arranged parallel to and between the first drain line 103a and the source line 105, and a second gate line 101b is arranged parallel to and between the source line 105 and the second drain line 103b.

The first drain line 103a has a plurality of first drain electrodes 104a extending in one direction perpendicular to the first drain line 103a and spaced apart by a predetermined interval from one another. The source line 105 has a plurality of first and second source electrodes 106a, 106b extending in both directions perpendicular to the source line 105 and spaced apart by a predetermined interval from one another. Preferably, the plurality of source electrodes 106a, 106b extending from the source line 105 are branched interdigitally from each other. For example, when the first source electrode 106a is first branched from the source line 105 in a first direction, the second source electrode 106b can be secondly branched from the source line 105 in a second direction opposite to the first direction. Also, the second drain line 103b has a plurality of second drain electrodes 104b extending perpendicularly to the second drain line 103b and spaced apart by a predetermined interval from one another.

At this time, the plurality of first drain electrodes 104a extending from the first drain line 103a and the plurality of first source electrodes 106a extending from the source line 105 are interdigitally arranged with a predetermined interval therebetween. The plurality of first drain electrodes 104a and the plurality of first source electrodes 106a are interdigitally arranged on and perpendicularly to the first gate line 101a. For example, the first drain electrode 104a is first arranged, the first source electrode 106a is then arranged, and the first drain electrode 104a is arranged thereafter. Thus, the first drain electrodes 104a and the source electrodes 106a can be interdigitally and repeatedly arranged. Accordingly, a plurality of thin film transistors (TFTs) including the first gate line 101a functioning as a common gate electrode, and the first drain electrodes 104a and the first source electrodes 106a arranged interdigitally are formed between the first drain line 103a and the source line 105. The plurality of TFTs are connected in parallel to one another.

Similarly, the second drain electrodes 104b extending from the second drain line 103b and the plurality of second source electrodes 106b extending from the source line 105 are interdigitally arranged likewise. The plurality of second drain electrodes 104b and the plurality of second source electrodes 106b are interdigitally arranged on and perpendicular to the second gate line 101b. Accordingly, a plurality of thin film transistors (TFTs) including the second gate line 101b functioning as a common gate electrode, and the second drain electrodes 104b and the second source electrodes 106b arranged interdigitally are formed between the second drain line 103b and the source line 105. The plurality of TFTs are connected in parallel to one another.

Thus, in the switching element of the present invention, the first drain line 103a and the second drain line 103b are formed at left and right sides of the source line 105. The source line 105 has the first and second source electrodes 106a, 106b branched interdigitally in both directions therefrom, the first drain line 103a has the first drain electrodes 104a extending in one direction therefrom and spaced apart by a predetermined interval from one another, and the second drain line 103b has the second drain electrodes 104b extending in one direction therefrom and spaced apart by a predetermined interval from one another. The first gate line 101a functioning as the common gate electrode is formed between the first drain line 103a and the source line 105, and the second gate line 101b functioning as the common gate electrode is formed between the second drain line 103b and the source line 105.

Accordingly, the plurality of TFTs including the first drain electrodes 104a, the first source electrodes 106a and the first gate line 101 are connected in parallel to one another between the first drain electrode 103a and the source line 105, and the plurality of TFTs including the second drain electrodes 104b, the second source electrodes 106b and the second gate line 101b are connected in parallel to one another between the second drain line 103b and the source line 105. In addition, reference numeral 107 denotes a semiconductor layer consisting of a channel layer and an ohmic contact layer.

In the present invention, it is noted that the first source electrode 106a is arranged adjacent to the two first drain electrodes 104a, thereby forming TFTs. In other words, one TFT is formed by the first source electrode 106a, the first drain electrode 104a adjacent upward thereto, and the first gate line 101a. Another TFT is formed by the first source electrode 106a, the first drain electrode 104a adjacent downward thereto, and the first gate line 101a. Accordingly, one source electrode is commonly used in forming a first TFT disposed above the one source electrode and a second TFT disposed below the one source electrode. In addition, the first drain electrode 104a can be also commonly used in forming two TFTs disposed above and below the first drain electrode 104a.

Thus, in the present invention, since two TFTs can be formed by one source electrode, and drain electrodes disposed above and below the source electrode, or since two TFTs can be formed by one drain electrode, and source electrodes disposed above and below the drain electrode, at least two TFTs can be formed in the same area. Accordingly, the arrangement of the present invention decreases the occupying area of the TFTs and minimizes the switching element, so that the switching element can be easily mounted on the liquid crystal panel.

Figure 6:
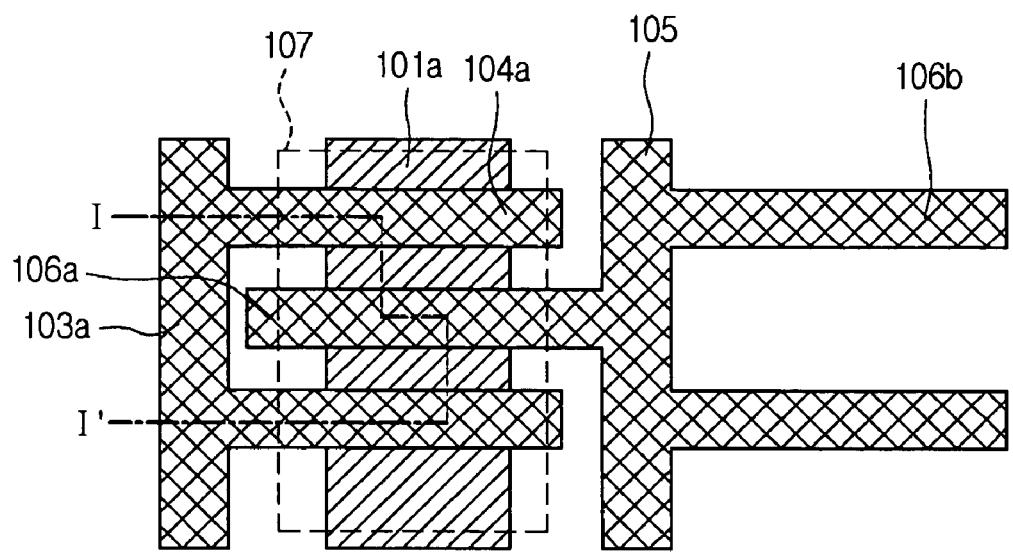
FIG. 6 is a detail plane view of the switching element of FIG. 5.
Figure 7:
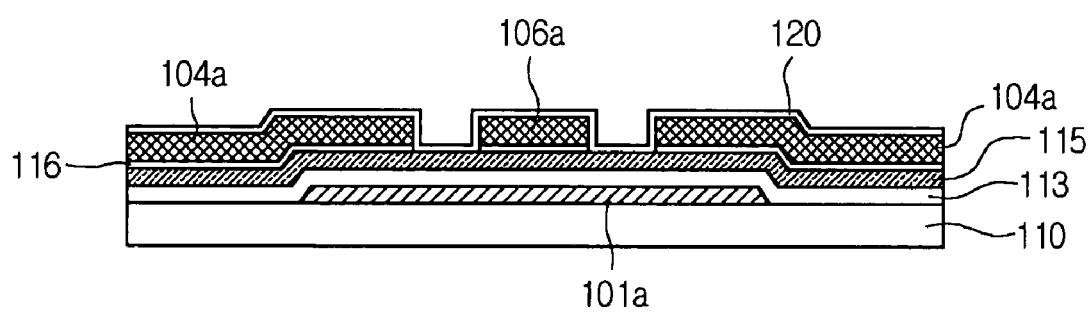
FIG. 7 is a cross-sectional view taken along the line I-I' of FIG. 6.

FIG. 6 is a detail plane view of the switching element of FIG. 5, and FIG. 7 is a cross-sectional view taken along the line I-I' of FIG. 6. As shown in FIGS. 6 and 7, the plurality of first drain electrodes 104a extending in one direction from the first drain line 103a and spaced apart by a predetermined interval from one another, and the plurality of source electrodes 106a, 106b extending in both directions (i.e., left and right directions) from the source line 105 are interdigitally arranged on and perpendicular to the first gate line 101a and are spaced apart by a predetermined interval from each other. Herein, the first source electrodes 106a extending toward the first drain line 103a and the first drain electrodes 104a extending toward the source line 105 from the first drain line 103a are interdigitally arranged with a predetermined interval therebetween. Accordingly, the first drain electrodes 104a and the first source electrodes 106a are interdigitally arranged on and perpendicular to the first gate line 101a with a predetermined interval therebetween. In this arrangement, one of the first source electrodes 106a forms two TFTs together with the two first drain electrodes 104a disposed above and below the first source electrode 106a. Accordingly, the one source electrode is commonly used for forming two TFTs. Also, one of the first drain electrodes 104a may form two TFTs together with the two first source electrodes 106a disposed above and below the first drain electrode 104a. Accordingly, the one drain electrode is commonly used for forming two TFTs.

Thus, since one source electrode or one drain electrode is commonly used for forming two TFTs, more many TFTs can be formed in the same area, thereby miniaturizing the switching element. Hence, a driving unit employing the above switching element can be mounted easily regardless of actual process margin, and its application can save the fabrication costs.

In addition, the semiconductor layer 107 functioning as a channel between the source and drain regions is formed on a region including the first gate line 101a, and the drain electrodes 104a and the source electrodes 106 arranged interdigitally. The semiconductor layer 107 has a stack structure of a channel layer 115 and an ohmic contact layer 116, which is ohmic contacted with the source and drain electrodes.

Figure 8A:
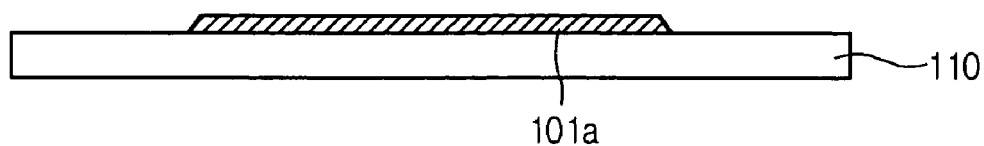
FIGS. 8A through 8D are cross-sectional views illustrating a method of fabricating the switching element shown in FIG. 6.

In FIG. 7, reference numeral 113 denotes a gate insulating layer for insulation of the gate electrode. FIGS. 8A through 8D are cross-sectional views illustrating a method of fabricating the switching element shown in FIG. 6. As shown in FIG. 8A, a gate metal film is deposited on a substrate 110 by a sputtering process and is then patterned by a photolithography process using a mask, thereby forming a first gate line 101a. Although not shown in the drawings, a second gate line 101b may be further formed by the same method. The gate metal film may be formed of chromium (Cr), molybdenum (Mo), aluminum alloy or the like in a structure of a single layer or double layers.

Figure 8B:
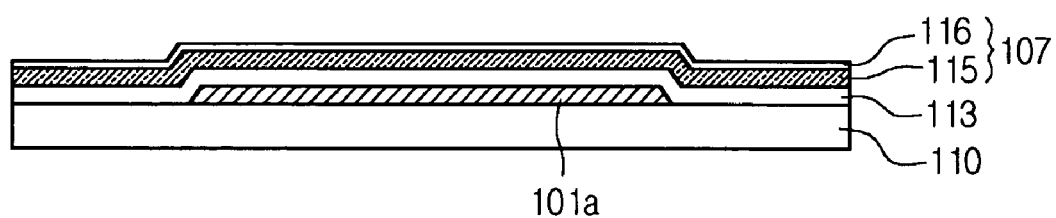

As shown in FIG. 8B, a gate insulating material is deposited on a resultant structure of the substrate 110 including the first gate line 101a, thereby. forming a gate insulating layer 113. The gate insulating layer 113 may be formed of inorganic material such as silicon oxide, silicon nitride or the like. A channel layer 115 functioning as a channel between the source and drain regions, and an ohmic contact layer 116 are sequentially formed on the gate insulating layer 113 by a PECVD or a sputtering process. The channel layer 115 may be formed of amorphous silicon, and the ohmic contact layer 116 may be formed of n+ amorphous silicon. The channel layer 115 and the ohmic contact layer 116 are patterned by a photolithography process, thereby forming the semiconductor layer 107 including the patterned channel layer 115 and the patterned ohmic contact layer 116, which are stacked in a cylinder structure having a relatively larger width than the width of the gate line 101a. The semiconductor layer 107 overlaps with and is formed integrally with the gate line 101a.

Figure 8C:
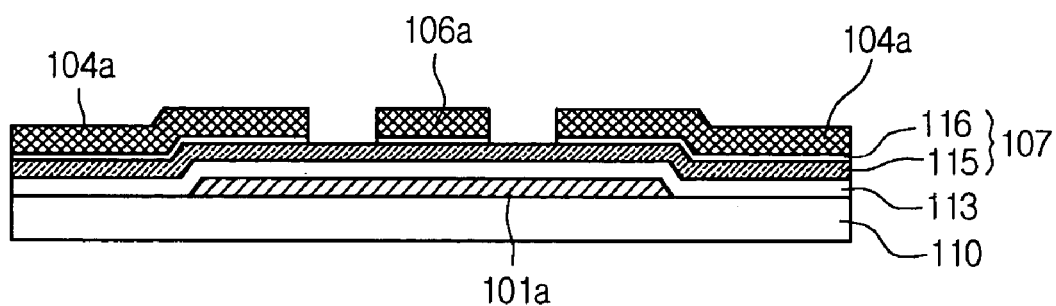

As shown in FIG. 8C, a source/drain metal film is deposited on a resultant structure of the substrate 110 including the semiconductor layer 107 by a PECVD or a sputtering process. The source/drain metal film may be fonrmed of molybdenum (Mo), titanium (Ti), tantalum (Ta), molybdenum (Mo) alloy or the like.

A photoresist pattern is formed on the deposited source/drain metal film by a photolithography process using a mask. The source/drain metal film is patterned by a wet etch using the photoresist pattern. As a result, the source line 105, the first source electrode 106a, the second source electrode 106b, the first drain line 103a, the first drain electrode 104a, the second drain line 103b, and the second drain electrodes 104b are formed. In other words, the source line 105 is formed between the first and second gate lines 101a, 101b, the plurality of first and second source electrodes 106a, 106b extending in both directions from the source line 105 are formed, the first drain line 103a is formed at a left side of the first gate line 101a, the plurality of first drain electrodes 104a extending in one direction from the first drain line 103a are formed, the second drain line 103b is formed at a right side of the second gate line 101b, and the plurality of second drain electrodes 104b extending in one direction from the second drain line 103b are formed.

Next, regions between the first source electrodes 106a and the first drain electrodes 104a are etched by an etch process, so that the ohmic contact layer 116 is removed and accordingly the channel layer 115 is exposed to an exterior. Likewise, although not shown in the drawing, the channel layer 115 may be exposed to the exterior at regions between the second source electrodes 106b and the second drain electrodes 104a.

Figure 8D:
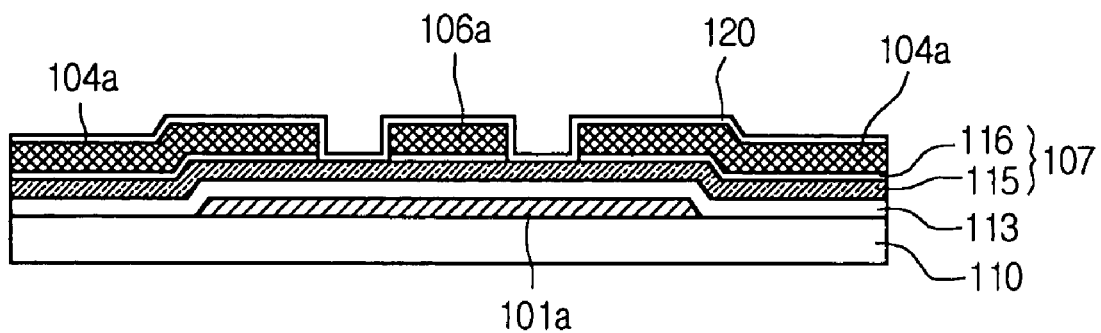

As shown in FIG. 8D, a passivation layer 120 is formed on the entire surface of a resultant structure of the substrate 110 including the first and second drain electrodes 104a and 104b, and the first and second source electrodes 106a, 106b by a deposition such as a PECVD process. By performing the aforementioned processes, the switching element having the structure shown in FIGS. 5 and 6 can be fabricated.

As described above, since more many TFTs can be formed in the same area, the occupying area of the switching element can be decreased, and accordingly a driving unit employing such a switching element can be easily mounted in a liquid crystal panel and the fabrication costs can be saved. Specifically, since one source electrode or one drain electrode is commonly used for forming two TFTs, many more TFTs can be formed in the same area. Therefore, the occupying area of a switching element including a plurality of buffer TFTs remarkably can be reduced, thereby allowing the mounting of a driving unit employing the switching element on a liquid crystal panel with ease. Also, since one source electrode or one drain electrode is commonly used for forming two TFTs, fabrication costs can be saved and the fabrication method can be simplified.

It will be apparent to those skilled in the art that various modifications and variations can be made in the LCD device of the present invention without departing from the spirit or scope of the invention. Thus, it is intended that the present invention covers the modifications and variations of this invention provided they come within the scope of the appended claims and their equivalents.

What is claimed is:

1. An liquid crystal display (LCD) device comprising:
a liquid crystal panel for displaying an image; and
a driving unit mounted on the liquid crystal panel and having a switching element for controlling an output, the switching element comprises:
first and second drain lines;
a source line between the first and second drain lines;
first and second gate lines between the first drain line and the source line and between the second drain line and the source line;
a plurality of first and second drain electrodes extending from the first and second drain lines; and
a plurality of first and second source electrodes extending in first and second directions from the source line,
wherein the plurality of first source electrodes are alternated with the plurality of first drain electrodes on the first gate line, and the plurality of second source electrodes are alternated with the plurality of second drain electrodes on the second gate line.

2. The LCD device according to claim 1, wherein the source line is arranged parallel with the first and second drain lines.

3. The LCD device according to claim 1, wherein the first and second gate lines are arranged parallel with the first and second drain lines.

4. The LCD device according to claim 1, wherein the first drain electrodes are arranged perpendicular to the first gate line.

5. The LCD device according to claim 1, wherein the second drain electrodes are arranged perpendicular to the second gate line.

6. The LCD device according to claim 1, wherein the first and second source electrodes are arranged interdigitally extending in the first and second directions from the source line.

7. The LCD device according to claim 1, wherein one of the first source electrodes is commonly used in a plurality of thin film transistors formed by the one source electrode, the first drain electrodes adjacently disposed above and below the one source electrode, and the first gate line.

8. The LCD device according to claim 1, wherein one of the second source electrodes is commonly used in a plurality of thin film transistors formed by the one source electrode, the second drain electrodes adjacently disposed above and below the one source electrode, and the second gate line.

9. The LCD device according to claim 1, wherein one of the first drain electrodes is commonly used in a plurality of thin film transistors formed by the one drain electrode, the first source electrodes adjacently disposed above and below the one drain electrode, and the first gate line.

10. The LCD device according to claim 1, wherein one of the second drain electrodes is commonly used in a plurality of thin film transistors formed by the one drain electrode, the second source electrodes adjacently disposed above and below the one drain electrode, and the second gate line.

11. The LCD device according to claim 1, wherein the switching element comprises a plurality of thin film transistors connected in parallel.

* * * * *